(12) United States Patent
Sun

(10) Patent No.: US 12,016,143 B2
(45) Date of Patent: Jun. 18, 2024

(54) FLEXIBLE DISPLAY SCREEN SUPPORTING STRUCTURE, METHOD FOR MANUFACTURING THE SAME, AND DISPLAY DEVICE

(71) Applicant: BOE Technology Group Co., Ltd., Beijing (CN)

(72) Inventor: Baofeng Sun, Beijing (CN)

(73) Assignee: BOE Technology Group Co., Ltd., Beijing (CN)

(*) Notice: Subject to any disclaimer, the term of this patent is extended or adjusted under 35 U.S.C. 154(b) by 0 days.

(21) Appl. No.: 17/760,962

(22) PCT Filed: Apr. 15, 2021

(86) PCT No.: PCT/CN2021/087444
§ 371 (c)(1),
(2) Date: Mar. 16, 2022

(87) PCT Pub. No.: WO2021/238483
PCT Pub. Date: Dec. 2, 2021

(65) Prior Publication Data
US 2023/0074489 A1 Mar. 9, 2023

(30) Foreign Application Priority Data

May 26, 2020 (CN) .......................... 202010453704.X

(51) Int. Cl.
*H05K 5/02* (2006.01)
(52) U.S. Cl.
CPC .................................. *H05K 5/0217* (2013.01)
(58) Field of Classification Search
CPC ........................... H05K 5/0217; H05K 5/0226
See application file for complete search history.

(56) References Cited

U.S. PATENT DOCUMENTS 10,091,896 B2 * 10/2018 Chu .................... H05K 5/0226
2018/0124937 A1 5/2018 Choi et al.
(Continued)

FOREIGN PATENT DOCUMENTS

CN 205451696 U 8/2016
CN 106783912 A 5/2017
(Continued)

OTHER PUBLICATIONS

CN 202010453704.X first office action.
PCT/CN2021/087444 international search report and written opinion.

*Primary Examiner* — Mukundbhai G Patel
(74) *Attorney, Agent, or Firm* — IPro, PLLC

(57) ABSTRACT

This application relates to a flexible display screen supporting structure for supporting a flexible display screen. The flexible display screen includes a bendable region and a non-bendable region spaced apart in a first direction. The flexible display screen supporting structure includes a flexible support layer, the flexible support layer includes a first surface and a second surface arranged opposite to each other, the first surface is used for connecting to a non-light-emitting side of the flexible display screen, and the second surface is divided into a first region and a second region that are spaced apart in the first direction. A rigid support plate is arranged on the first region, a plurality of rigid support strips that are parallel to each other are arranged at intervals on the second region, and each of the plurality of rigid support strips extends along a direction perpendicular to the first direction.

14 Claims, 3 Drawing Sheets

(56) References Cited

U.S. PATENT DOCUMENTS

| | | | |
|---|---|---|---|
| 2018/0182993 A1 | 6/2018 | Tang | |
| 2019/0036068 A1* | 1/2019 | Kim | ............... G06F 1/1601 |
| 2019/0208649 A1 | 7/2019 | Jeon et al. | |
| 2022/0248548 A1 | 8/2022 | Zhong et al. | |

FOREIGN PATENT DOCUMENTS

| | | | | |
|---|---|---|---|---|
| CN | 109830185 A | 5/2019 | | |
| CN | 109859630 A | 6/2019 | | |
| CN | 110264885 A | 9/2019 | | |
| CN | 110445913 A | 11/2019 | | |
| CN | 209657035 U | 11/2019 | | |
| CN | 110784567 A | 2/2020 | | |
| CN | 110809073 A | 2/2020 | | |
| CN | 210075297 U | 2/2020 | | |
| CN | 111583803 A | 8/2020 | | |
| EP | 3301506 A1 * | 4/2018 | ....... | G02F 1/133305 |
| EP | 3993372 A1 | 5/2022 | | |
| KR | 20200049925 A | 5/2020 | | |

\* cited by examiner

FLEXIBLE DISPLAY SCREEN SUPPORTING STRUCTURE, METHOD FOR MANUFACTURING THE SAME, AND DISPLAY DEVICE

CROSS-REFERENCE TO RELATED APPLICATIONS

This application is the U.S. national phase of PCT Application No. PCT/CN2021/087444 filed on Apr. 15, 2021, which claims a priority to Chinese Patent Application No. 202010453704.X filed in China on May 26, 2020, the disclosure of which is incorporated in its entirety by reference herein.

TECHNICAL FIELD

The present disclosure relates to the technical field of manufacturing display products, and more particularly to a flexible display screen supporting structure, a method for manufacturing the same, and a display device.

BACKGROUND

Nowadays, flexible display panels gradually enter the consumer's field of vision, and the foldable nature of a screen greatly expands its application in a display field. However, the flexible folding panel still faces many problems, such as low mechanical strength and poor support and insufficient flatness of the screen after being folded many times, which will reduce the operating experience of users. However, in structure designs to solve the above problems, if the mechanical strength and support performance are improved, there will be a problem of low bending performance, while if the bending performance is improved, the mechanical strength will be reduced, resulting in the problem of insufficient flatness.

SUMMARY

In order to solve the above-mentioned technical problem, the present disclosure provides a flexible display screen supporting structure, a method for manufacturing the same, and a display device, so as to solve a problem that the supporting strength and bending performance of a bendable region of a flexible display screen cannot be satisfied at the same time.

In order to achieve the above-mentioned objective, technical solutions adopted by the present disclosure are: a flexible display screen supporting structure for supporting a flexible display screen. The flexible display screen includes a bendable region and a non-bendable region that are spaced apart in a first direction. The flexible display screen supporting structure includes a flexible support layer, the flexible support layer includes a first surface and a second surface arranged opposite to each other, the first surface is used for connecting to a non-light-emitting side of the flexible display screen, and the second surface is divided into a first region and a second region that are spaced apart in the first direction. A rigid support plate is arranged on the first region, a plurality of rigid support strips that are parallel to each other are arranged at intervals on the second region, and each of the plurality of rigid support strips extends along a direction perpendicular to the first direction. An orthographic projection of the first region onto the flexible display screen overlaps the non-bendable region, and an orthographic projection of the second region onto the flexible display screen overlaps the bendable region, when the flexible support layer is connected to the non-light-emitting side of the flexible display screen; and the flexible support layer further includes a flexible strip-shaped protrusion protruding between two adjacent rigid support strips.

Optionally, the flexible strip-shaped protrusion and the flexible support layer are of an integral structure.

Optionally, the flexible strip-shaped protrusion and the flexible support layer are made of rubber or silica gel.

Optionally, the flexible strip-shaped protrusion is recessed in a direction close to the first surface to form a strip-shaped groove, and an extension direction of the strip-shaped groove is the same as an extension direction of the flexible strip-shaped protrusion.

Optionally, a thickness of the rigid support plate in a direction perpendicular to the flexible support layer is the same as a thickness of the rigid support strip in the direction perpendicular to the flexible support layer, and the thickness of the rigid support plate in the direction perpendicular to the flexible support layer ranges from 0.3 mm to 0.5 mm.

Optionally, a spacing between two adjacent rigid support strips ranges from 0.6 mm to 1.2 mm.

Optionally, a width of each of the rigid support strips in a second direction ranges from 1.0 mm to 1.5 mm, and the second direction is parallel to the second surface and perpendicular to an extension direction of the rigid support strip.

Optionally, the rigid support plate and the rigid support strips are made of metal.

Optionally, a protective frame capable of surrounding a periphery of the flexible display screen is further included, where the rigid support plate includes an edge connection member exposed at the first region of the flexible support layer, and the protective frame is connected to the edge connection member.

Optionally, the light-emitting side of the flexible display screen is provided with a cover plate, and the cover plate includes a central region covering the flexible display screen and a peripheral area exposed to the flexible display screen. In a direction perpendicular to the rigid support plate, the protective frame includes a first portion arranged at a periphery of the cover plate and a second portion located at the periphery of the flexible display screen, and the first portion and the second portion form a step structure that is connected to a peripheral region of the cover plate.

Optionally, the edge connection member includes a plurality of through holes, and the protective frame further includes a third portion insertable into the through holes.

Optionally, the protective frame includes a first connecting portion connected to the rigid support plate, and a second connecting portion connected to the rigid support strips. The first connecting portion is connected to the edge connection member, and the second connecting portion includes two shielding portions extending away from the flexible support layer and shielding both ends of each of the rigid support strips.

Optionally, the protective frame is made of a flexible material.

Embodiments of the present disclosure also provide a display device including a flexible display screen and the above-mentioned flexible display screen supporting structure. The flexible support layer is connected to the non-light-emitting side of the flexible display screen, the orthographic projection of the first region of the flexible support layer onto the flexible display screen overlaps the non-bendable region of the flexible display screen, and the orthographic projection of the second region of the flexible support layer onto the flexible display screen overlaps the bendable region of the flexible display screen.

Embodiments of the present disclosure also provide a method for manufacturing the above-mentioned flexible display screen supporting structure. The flexible display screen supporting structure further includes a protective frame which can surround the periphery of the flexible display screen, the rigid supporting plate includes an edge connection member exposed at the first region of the flexible support layer, and the protective frame is connected to the edge connection member. The manufacturing method includes:

forming the flexible support layer by an injection molding process, and connecting the flexible support layer, the rigid support plate, and the rigid support strips into one body; and forming the above-mentioned protective frame by the injection molding process, and connecting the protective frame to the edge connection member of the rigid support plate.

Embodiments of the present disclosure also provide an assembly method of the above-mentioned display device. The display device includes a housing, a flexible display screen, the above-mentioned flexible display screen supporting structure, and a rotating shaft structure and a hardware structure mounted in the housing and configured to control bending of the flexible display screen, the assembly method includes:

assembling the rotating shaft structure in the housing;

assembling the hardware structure in the housing;

assembling the flexible display screen with the flexible display screen supporting structure; and assembling the assembled flexible display screen and flexible display screen supporting structure into the housing.

The present disclosure has advantageous effects: the rigid support plate corresponding to the flexible display screen and the rigid support strips corresponding to the bendable region of the flexible display screen are connected together via the flexible support layer, and the plurality of rigid support strips arranged at intervals cooperate with the flexible support layer, which ensures both the support performance of the bendable region of the flexible display screen and the bending performance of the bendable region of the flexible display screen.

DETAILED DESCRIPTION

Figure 1:
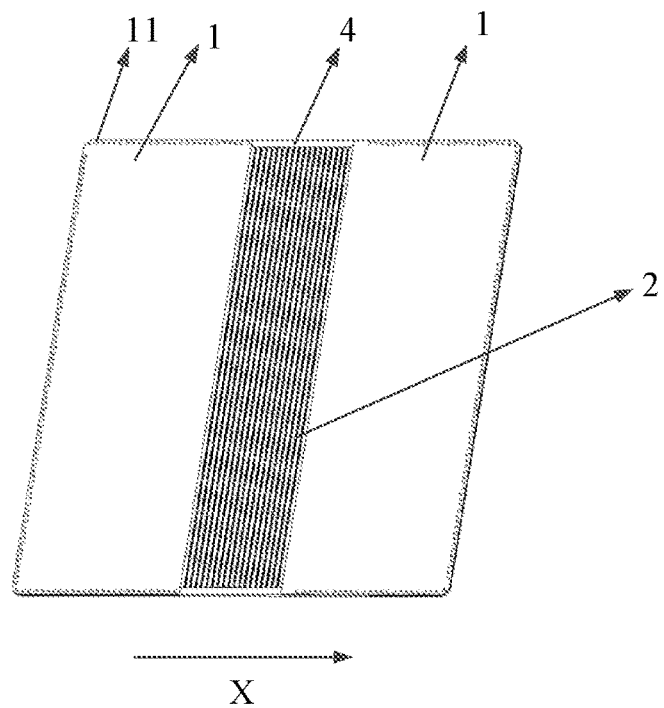
FIG. 1 is a partial schematic diagram of a flexible display screen supporting structure according to a first embodiment of the present disclosure.
Figure 2:
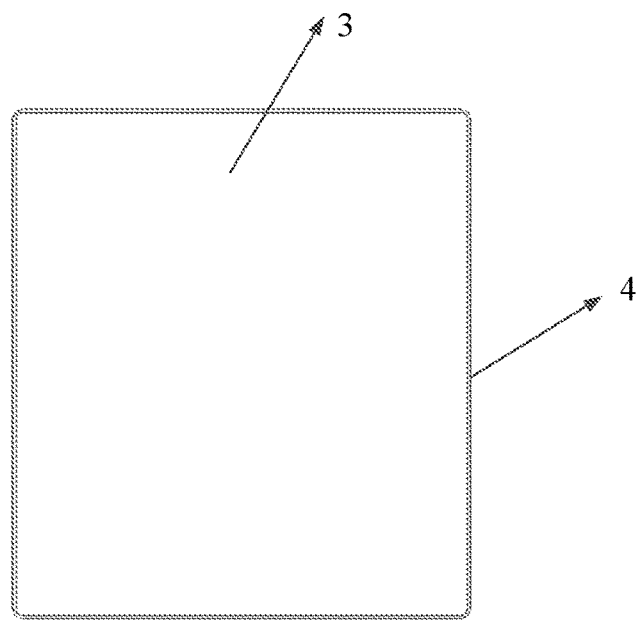
FIG. 2 is a partial structural diagram of a flexible display screen supporting structure according to a second embodiment of the present disclosure.

To further clarify the objectives, technical features and advantages of embodiments of the present disclosure, technical solutions in the embodiments of the present disclosure will be clearly and completely described below in combination with the drawings in the present disclosure. It is apparent that the described embodiments are not all embodiments but part of embodiments of the present disclosure. Based on the described embodiments in the present disclosure, all other embodiments obtained by a person of ordinary skill in the art are within the scope of protection of this disclosure.

In the description of the present disclosure, it should be noted that the orientation or positional relationship indicated by such terms as "center", "top", "bottom", "left", "right", "vertical", "horizontal", "inner", "outer" is based on the orientation or positional relationship shown in the drawings, and is merely for convenience of describing the present disclosure and simplifying the description, but not intended or implied that the referenced device or element must have a particular orientation, be constructed and operated in a particular orientation, and thus should not be construed as limiting the present disclosure. The terms "first", "second", and "third" are used for descriptive purposes only and are not to be construed as indicating or implying relative importance.

A current strengthening structure for a flexible screen module mainly adds a full-face steel sheet or a patterned steel sheet structure on the back of a screen to improve the module supportability and bending performance. However, the arrangement of the full-face steel sheet has a low softness and is not easy to be bent. For the arrangement of the patterned steel sheet structure, the patterned structure is generally formed by etching on the full-face steel sheet, which is still an integral structure made of a rigid material; and when a flexible display screen is bent, the patterned structure still needs to bear a bending stress, thereby limiting the bending performance of the flexible display screen.

With regard to the above-mentioned technical problems, with reference to FIGS. 1 to 6, embodiments of the present disclosure provide a flexible display screen supporting structure, which is used for supporting the flexible display screen, where the flexible display screen 10 includes a bendable region and a non-bendable region that are alternately arranged in a first direction. The flexible display screen supporting structure includes: a flexible support layer 3, where the flexible support layer 3 includes a first surface and a second surface opposite to each other, the first surface is used for connecting to a non-light-emitting side of the flexible display screen 10, and the second surface is divided into a first region and a second region which are alternately arranged along the first direction (referring to X direction in FIG. 1). A rigid support plate 1 is arranged on the first region, a plurality of rigid support strips 2 which are parallel to each other are arranged at intervals on the second region, and the plurality of the rigid support strips 2 extends along a direction perpendicular to the first direction. When the flexible support layer 3 is connected to the non-light-emitting side of the flexible display screen 10, an orthographic projection of the first region onto the flexible display screen overlaps the non-bendable region, and an orthographic projection of the second region onto the flexible display screen overlaps the bendable region.

The rigid support plate 1 corresponding to the flexible display screen 10 and the rigid support strips 2 corresponding to the bendable region of the flexible display screen 10 are connected together via the flexible support layer 3, and the plurality of the rigid support strips 2 arranged at intervals cooperate with the flexible support layer 3, which ensures both the support performance of the bendable region of the flexible display screen 10 and the bending performance of the bendable region of the flexible display screen 10.

With respect to the patterned steel sheet structure, in the embodiments, the plurality of the rigid support strips 2 are arranged at intervals and are arranged independently of each other, any two of the rigid support strips 2 are not connected to each other, and the plurality of the rigid support strips 2 constitute a support structure corresponding to a bendable region of a flexible display screen 10 via the flexible support layer 3. During bending, a portion of the flexible support layer 3 located between two adjacent the rigid support strips 2 stretches and deforms to ensure the bending performance of the flexible display screen 10; moreover, the arrangement of the rigid support strips 2 ensures the mechanical strength of the bendable region of the flexible display screen 10, thereby achieving the combination of softness and hardness, effectively overcoming the problems of the poor flatness and support nature of the bendable region of the flexible display screen 10, and greatly improving the reliability of terminal assembly.

In an embodiment, each of the rigid support strips 2 is of a rectangular parallelepiped structure, the plurality of rigid support strips 2 have the same shape, and the plurality of rigid support strips 2 are uniformly distributed in the second region of the flexible support layer 3, but which is not limited thereto.

In an embodiment, the number of the first regions is arranged to be the same as the number of non-bendable regions on the flexible display screen 10, and the number of the second regions is arranged to be the same as the number of bendable regions on the flexible display screen 10, so that the rigid support plate 1 located at the first regions correspondingly supports the non-bendable regions of the flexible display screen 10, and the rigid support strips 2 located at the second regions correspondingly support the bendable regions of the flexible display screen 10.

Figure 5:
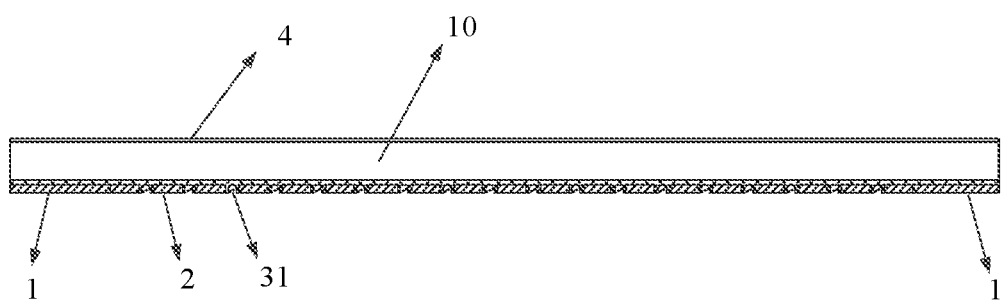
FIG. 5 is a partial schematic structural diagram of a flexible display screen coupled to a flexible display screen supporting structure in accordance with a first embodiment of the present disclosure.
Figure 6:
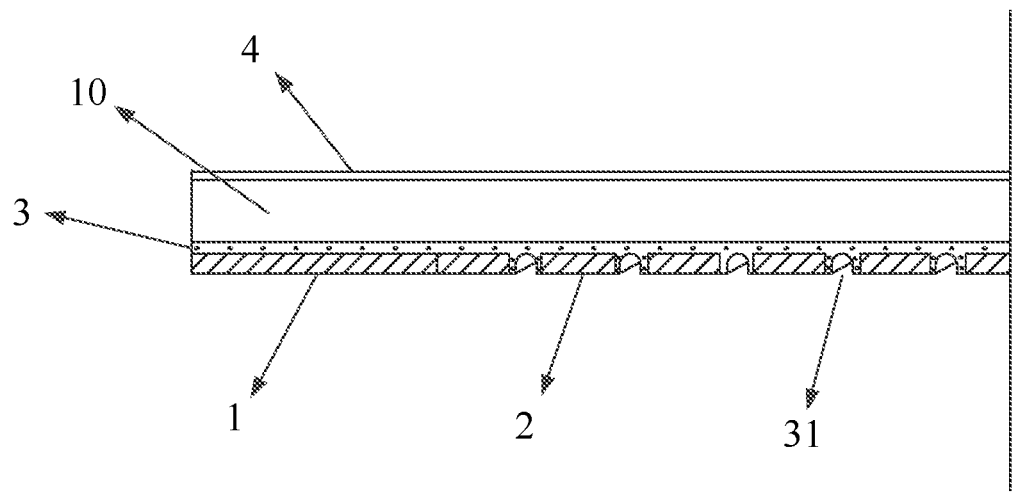
FIG. 6 is an enlarged schematic diagram of a portion of FIG. 5.

In an embodiment, in order to avoid a crease occurring at the junction of the bendable region and the non-bendable region of the flexible display screen 10 when being bent, a gap between rigid support strips 2 adjacent to a rigid support plate 1 and the corresponding rigid support plate 1 is zero, with reference to FIGS. 5 and 6.

The plurality of the rigid support strips 2 are mutually independent and are connected together by the flexible support layer 3. In order to increase the connection stability of the rigid support strips 2, in an embodiment, the flexible support layer 3 further includes a flexible strip-shaped protrusion protruding between two adjacent the rigid support strips 2, with reference to FIGS. 5 and 6.

In an embodiment, the flexible strip-shaped protrusion and the flexible support layer 3 are of an integral structure.

The arrangement of the flexible strip-shaped protrusions increases a connection area between the flexible support layer 3 and the rigid support strips 2, which in turn increases the connection strength between the rigid support strips 2 and the flexible support layer 3.

In an embodiment, each of the flexible strip-shaped protrusion and the flexible support layer is made of rubber or silica gel, which is not limited thereto, as long as a flexible material for making the flexible strip-shaped protrusion and the flexible support layer has a relatively high elasticity and self-recovery capability (facilitating the transition of the flexible display screen from a bent state to a planar state).

In an embodiment, the flexible strip-shaped protrusion is recessed in a direction close to the first surface to form a strip-shaped groove 31, and an extension direction of the strip-shaped groove is the same as that of the flexible strip-shaped protrusion.

With reference to FIGS. 5 and 6, an opening direction of the strip-shaped groove 31 faces away from the flexible display screen 10, and when the flexible display screen 10 is bent, two side walls of the strip-shaped groove 31 move towards each other, reducing the subjected stress and improving the bendability.

The depth of the strip-shaped groove 31 and the width of the strip-shaped groove 31 in the first direction may be set according to actual needs, and in one of the embodiments, the depth of the strip-shaped groove 31 is the same as the thickness of the rigid support strip 2 (the thickness in the direction perpendicular to the flexible support layer 3), but is not limited thereto.

The depth of the strip-shaped groove 31 and the width of the strip-shaped groove 31 in the first direction are set to satisfy the following conditions: when the bendable region of the flexible display screen 10 bends to a maximum bending state (generally forming a semi-circular arc state), two side walls of the strip-shaped groove 31 just contact. That is, two side walls of the strip-shaped groove 31 do not contact before the flexible display screen 10 bends to the maximum bending state, limiting the bending degree of the flexible display screen 10; and a spacing do not exist between the two side walls of the strip-shaped groove 31 when the flexible display screen 10 is bent to the maximum bent state, which adversely affect the mechanical strength of the bendable region of the flexible display screen 10.

In an embodiment, a thickness of the rigid support plate 1 in a direction perpendicular to the flexible support layer is the same as a thickness of the rigid support strip 2 in the direction perpendicular to the flexible support layer 3, and the thickness of the rigid support plate 1 in the direction perpendicular to the flexible support layer ranges from 0.3 mm to 0.5 mm, but not limited thereto.

In an embodiment, a spacing between two adjacent rigid support strips 2 ranges from 0.6 mm to 1.2 mm, but is not limited thereto.

In an embodiment, the rigid support strip 2 has a width of 1.0 mm to 1.5 mm in a second direction parallel to the second surface and perpendicular to the extension direction of the rigid support strip (the second direction is the first direction), but is not limited thereto.

In an embodiment, both the rigid support plate 1 and the rigid support strips 2 are made of metal, and may have a heat dissipation effect while ensuring support performance.

In an implementation of the embodiments, the rigid support plate 1 and the rigid support strips 2 are made of copper, which, however, are not limited thereto.

In an embodiment, the flexible support layer 3 is made of a flexible material such as rubber, and has a certain amount of stretching and recovery capability, so as to compensate for the deformation amount required by the bendable region during the bending process of the flexible display screen 10.

In an embodiment, the flexible support layer 3 is formed by an injection molding process. When the flexible support layer 3 is formed by the injection molding process, and the flexible support layer 3 is connected to the rigid support plate 1 and the rigid support strips 2 as an integral body by the injection molding process, simplifying the process and improving the stability of connections between the flexible support layer 3, the rigid support plate 1 and the rigid support strips 2.

Figure 3:
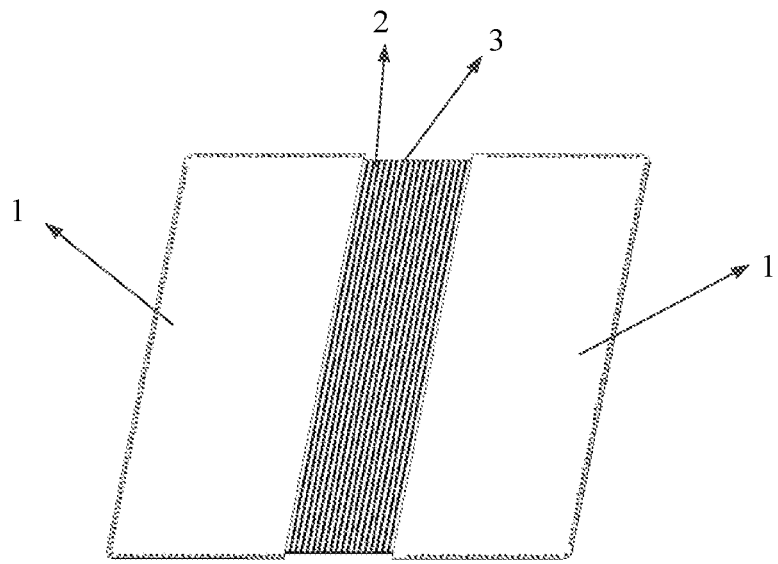
FIG. 3 is a schematic structural diagram of a flexible display screen supporting structure according to a first embodiment of the present disclosure.
Figure 4:
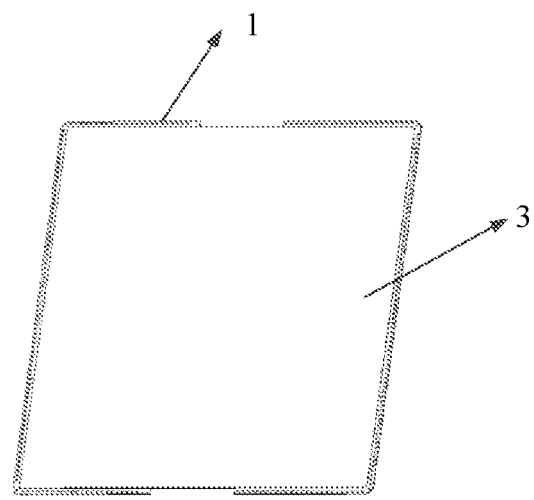
FIG. 4 is a schematic structural diagram of a flexible display screen supporting structure according to a second embodiment of the present disclosure.

In an embodiment, the flexible display screen supporting structure further includes a protective frame 4 that can surround a periphery of the flexible display screen 10, the rigid support plate 1 includes an edge connection member exposed at the first region of the flexible support layer 3, and the protective frame 4 is connected to the edge connection member, with reference to FIGS. 3 and 4.

The protective frame 4 is connected to the flexible support layer 3, the rigid support plate 1 and the rigid support strips 2 as a whole to form an accommodating space capable of accommodating the flexible display screen 10, and the protective frame 4 surrounds the periphery of the flexible display screen 10 to protect the flexible display screen 10.

A cover plate 20 is provided on a light-emitting side of the flexible display screen 10, the cover plate 20 includes a central region covering the flexible display screen 10 and a peripheral region exposed to the flexible display screen 10, and in the direction perpendicular to the rigid support plate, the protective frame 4 includes a first portion 41 arranged at the periphery of the cover plate 20 and a second portion 42 located at the periphery of the flexible display screen 10. The first portion 41 and the second portion 42 form a step structure connected to a peripheral region of the cover plate 20 so as to protect the cover plate 20, with reference to FIG. 7.

In an embodiment, the edge connection member includes a plurality of through holes 11, and the protective frame 4 further includes a third portion 43 that can be inserted into the through holes 11.

Figure 7:
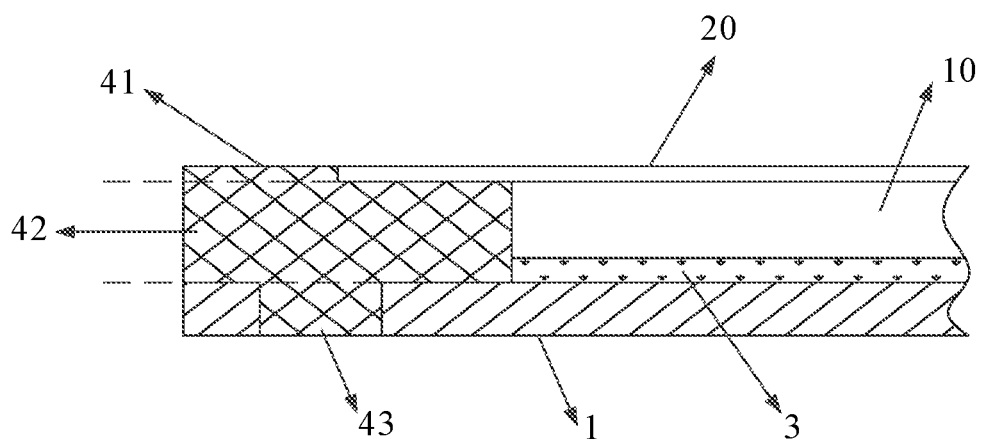
FIG. 7 is a partial schematic structural diagram of a flexible display screen coupled to a flexible display screen supporting structure according to a second embodiment of the present disclosure.

With reference to FIG. 7, the arrangement of the through holes 11 improves the stability of a connection between the protective frame 4 and the rigid support plate 1.

The plurality of the through holes 11 are uniformly arranged at the edge connection member, the rigid support plate 1 is rectangular and includes a first edge adjacent to the rigid support strips 2 and three other edges except the first edge. The edge connection member includes three other edges except the first edge, and the plurality of the through holes 11 are uniformly arranged at each edge in the extension direction thereof.

In an embodiment, the protective frame 4 includes a first connecting portion connected to the rigid support plate 1, and a second connecting portion connected to the rigid support strips 2, where the first connecting portion is connected to the edge connection member, and the second connecting portion includes two shielding portions extending away from the flexible support layer 3 and shielding both ends of the rigid support strip 2.

One end of the shielding portion away from the flexible support layer 3 is flush with a surface of the rigid support plate 1 away from the flexible support layer 3, so that the rigid support strips 2 are located inside the protective frame 4, the rigid support strips 2 are prevented from being exposed, so as to protect the rigid support strips 2, to prevent the rigid support strips 2 from being directly separated from the flexible support layer 3 by an external force, and to beautify the appearance.

In an embodiment, the protective frame 4 is made of a flexible material.

In one of the embodiments, the protective frame 4 is formed by injection molding with a rubber material, the protective frame 4 is of an integral structure, and the connection between the protective frame 4, the rigid support plate 1, the rigid support strips 2, and the flexible support layer 3 which are connected as an integral structure is also achieved by an injection molding process, which is simple and quick.

Embodiments of the present disclosure also provide a display device including a flexible display screen 10 and the above-mentioned flexible display screen supporting structure. The flexible support layer 3 is connected to a non-light-emitting side of the flexible display screen 10, an orthographic projection of a first region of the flexible support layer 3 onto the flexible display screen 10 overlaps an orthographic projection of a non-bendable region of the flexible display screen 10, and an orthographic projection of a second region of the flexible support layer 3 onto the flexible display screen overlaps a bendable region of the flexible display screen 10.

The rigid support plate 1 corresponding to the flexible display screen 10 and the rigid support strips 2 corresponding to the bendable region of the flexible display screen 10 are connected together via the flexible support layer 3, and the plurality of the rigid support strips 2 arranged at intervals cooperate with the flexible support layer 3, which ensures both the support performance of the bendable region of the flexible display screen 10 and the bending performance of the bendable region of the flexible display screen 10.

Embodiment of the present disclosure also provide a method for manufacturing a flexible display screen supporting structure, which is used to form the above-mentioned flexible display screen supporting structure. The flexible display screen supporting structure further includes a protective frame that is capable of surrounding a periphery of the flexible display screen, the rigid support plate includes an edge connection member exposed at the first region of the flexible support layer, and the protective frame is connected to the edge connection member. The manufacturing method includes: forming a flexible support layer 3 by an injection molding process, and connecting the flexible support layer 3, the rigid support plate 1, and the rigid support strips 2 as one body; and forming the above-mentioned protective frame 4 by an injection molding process, and connecting the protective frame 4 to the edge connection member of the rigid support plate 1.

The connections between the flexible support layer 3, the rigid support plate 1, the rigid support strips 2 and the protective frame 4 are all completed by the injection molding process, without providing the additional connecting structure such as an adhesive glue or a screw, so as to beautify the appearance while ensuring the connection strength.

Embodiments of the present disclosure also provide an assembly method of the above-mentioned display device. The display device includes a housing, a flexible display screen, the above-mentioned flexible display screen supporting structure, a rotating shaft structure, and a hardware structure mounted in the housing and configured to control the bending of the flexible display screen. The assembly method includes:

assembling the rotating shaft structure in the housing;
assembling the hardware structure in the housing;
assembling the flexible display screen with the flexible display screen supporting structure; and
assembling the assembled flexible display screen and the flexible display screen supporting structure into the housing.

It should be noted that the rotating shaft structure includes a rotating shaft, multi-link rods, a sliding rod, etc. Before the rotating shaft structure is assembled into the housing, the rotating shaft needs to be connected to components such as the multi-link rods and the sliding rod, so as to complete the assembly of the rotating shaft structure (a specific composition of the rotating shaft structure is common knowledge in the art, and will not be described in detail herein).

It should be noted that the hardware structure includes a camera, a speaker, and the like.

The foregoing embodiments are only part of optimal embodiments of the present disclosure. It should be noted that a person of ordinary skill in the art can make various improvements and modifications without departing from the principle of the present disclosure, and theses improvement and modifications shall fall within the protection scope of the present disclosure.

What is claimed is:

1. A flexible display screen supporting structure, configured to support a flexible display screen, wherein the flexible display screen comprises a bendable region and a non-bendable region that are spaced apart in a first direction,
    wherein the flexible display screen supporting structure comprises a flexible support layer, the flexible support layer comprises a first surface and a second surface arranged opposite to each other, the first surface is used for connecting to a non-light-emitting side of the flexible display screen, and the second surface is divided into a first region and a second region that are spaced apart in the first direction;
    a rigid support plate is arranged on the first region, a plurality of rigid support strips that are parallel to each other are arranged at intervals on the second region, and each of the plurality of rigid support strips extends along a direction perpendicular to the first direction;
    an orthographic projection of the first region onto the flexible display screen overlaps the non-bendable region, and an orthographic projection of the second region onto the flexible display screen overlaps the bendable region, when the flexible support layer is connected to the non-light-emitting side of the flexible display screen; and
    the flexible support layer further comprises a flexible strip-shaped protrusion protruding between two adjacent rigid support strips;
    wherein the flexible display screen supporting structure further comprises a protective frame capable of surrounding a periphery of the flexible display screen, wherein the rigid support plate comprises an edge connection member exposed at the first region of the flexible support layer, and the protective frame is connected to the edge connection member;
    wherein the protective frame is made of a flexible material.

2. The flexible display screen supporting structure according to claim 1, wherein the flexible strip-shaped protrusion and the flexible support layer are of an integral structure.

3. The flexible display screen supporting structure according to claim 2, wherein the flexible strip-shaped protrusion and the flexible support layer are made of rubber or silica gel.

4. The flexible display screen supporting structure according to claim 1, wherein the flexible strip-shaped protrusion is recessed in a direction close to the first surface to form a strip-shaped groove, and an extension direction of the strip-shaped groove is the same as an extension direction of the flexible strip-shaped protrusion.

5. The flexible display screen supporting structure according to claim 1, wherein a thickness of the rigid support plate in a direction perpendicular to the flexible support layer is the same as a thickness of the rigid support strip in the direction perpendicular to the flexible support layer, and the thickness of the rigid support plate in the direction perpendicular to the flexible support layer ranges from 0.3 mm to 0.5 mm.

6. The flexible display screen supporting structure according to claim 1, wherein a spacing between two adjacent rigid support strips ranges from 0.6 mm to 1.2 mm.

7. The flexible display screen supporting structure according to claim 1, wherein a width of each of the rigid support strips in a second direction ranges from 1.0 mm to 1.5 mm, and the second direction is parallel to the second surface and perpendicular to an extension direction of the rigid support strip.

8. The flexible display screen supporting structure according to claim 1, wherein the rigid support plate and the rigid support strips are made of metal.

9. The flexible display screen supporting structure according to claim 1, wherein the light-emitting side of the flexible display screen is provided with a cover plate, and the cover plate comprises a central region covering the flexible display screen and a peripheral area exposed to the flexible display screen,
    wherein, in a direction perpendicular to the rigid support plate, the protective frame comprises a first portion arranged at a periphery of the cover plate and a second portion located at the periphery of the flexible display screen, and the first portion and the second portion form a step structure that is connected to a peripheral region of the cover plate.

10. The flexible display screen supporting structure according to claim 9, wherein the edge connection member comprises a plurality of through holes, and the protective frame further comprises a third portion insertable into the through holes.

11. The flexible display screen supporting structure according to claim 1, wherein the protective frame comprises a first connecting portion connected to the rigid support plate, and a second connecting portion connected to the rigid support strips,
    wherein the first connecting portion is connected to the edge connection member, and the second connecting portion comprises two shielding portions extending away from the flexible support layer and shielding both ends of each of the rigid support strips.

12. A display device, comprising a flexible display screen and the flexible display screen supporting structure according to claim 1, wherein the flexible support layer is connected to the non-light-emitting side of the flexible display screen, the orthographic projection of the first region of the flexible support layer onto the flexible display screen overlaps the non-bendable region of the flexible display screen, and the orthographic projection of the second region of the flexible support layer onto the flexible display screen overlaps the bendable region of the flexible display screen.

13. The method of assembling the display device according to claim 12, wherein the display device comprises a housing, a flexible display screen, the flexible display screen supporting structure, and a rotating shaft structure and a hardware structure mounted in the housing and configured to control bending of the flexible display screen, and the method comprises:
    assembling the rotating shaft structure in the housing;
    assembling the hardware structure in the housing;
    assembling the flexible display screen with the flexible display screen supporting structure; and assembling the assembled flexible display screen and the flexible display screen supporting structure into the housing.

14. A method for manufacturing the flexible display screen supporting structure according to claim 1, wherein the flexible display screen supporting structure further comprises a protective frame capable of surrounding a periphery of the flexible display screen, the rigid support plate comprises an edge connection member exposed at the first region of the flexible support layer, and the protective frame is connected to the edge connection member, wherein the manufacturing method comprises:

forming the flexible support layer by an injection molding process, and connecting the flexible support layer, the rigid support plate, and the rigid support strips into one body; and forming a protective frame by using a metal material with the injection molding process, and connecting the protective frame to the edge connection member of the rigid support plate.

* * * * *